United States Patent
Lee

(10) Patent No.: US 7,678,602 B2
(45) Date of Patent: Mar. 16, 2010

(54) CMOS IMAGE SENSOR AND METHOD FOR MANUFACTURING THE SAME

(75) Inventor: Chang Eun Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 19 days.

(21) Appl. No.: 11/615,086

(22) Filed: Dec. 22, 2006

(65) Prior Publication Data

US 2007/0166865 A1  Jul. 19, 2007

(30) Foreign Application Priority Data

Dec. 29, 2005  (KR) .................. 10-2005-0134180

(51) Int. Cl.
*H01L 27/146* (2006.01)
(52) U.S. Cl. ............. 438/57; 257/E21.12; 257/E27.133
(58) Field of Classification Search .......... 257/E27.133, 257/E27.171, E21.12; 438/57, 65, 69, 71
See application file for complete search history.

(56) References Cited

U.S. PATENT DOCUMENTS

| 6,570,222 | B2 * | 5/2003 | Nozaki et al. ............ 257/347 |
| 6,909,162 | B2 * | 6/2005 | Wu et al. ................. 257/461 |
| 7,164,182 | B2 * | 1/2007 | Mouli ..................... 257/436 |
| 7,294,522 | B2 * | 11/2007 | Shim ........................ 438/57 |
| 2008/0048221 | A1 * | 2/2008 | Lee ........................ 257/292 |

FOREIGN PATENT DOCUMENTS

KR  10-2001-0014554  10/2001

OTHER PUBLICATIONS

M. Bartek, et al., "An Integrated Silicon Colour Sensor Using Selective Epitaxial Growth", 1994, Sensors and Actuators A: Physical, 41-42, pp. 123-128.*

* cited by examiner

*Primary Examiner*—Lynne A. Gurley
*Assistant Examiner*—Colleen A Matthews
(74) *Attorney, Agent, or Firm*—Saliwanchik, Lloyd & Saliwanchik

(57) ABSTRACT

A CMOS image sensor and a method for manufacturing the same are provided. The method includes: preparing a semiconductor substrate in which a device isolation region and an active region are defined; forming a gate pattern including a gate oxide layer and a gate electrode on the semiconductor substrate; implanting n-type impurity ions in a predetermined part of the active region of the semiconductor substrate to form a photodiode region; forming a spacer at a sidewall of the gate pattern; forming a p-type impurity region at a surface of the photodiode region; forming an epitaxial layer on the semiconductor substrate and the gate pattern except for on the device isolation region and the spacers by performing a selective epitaxial growth; and implanting n+ type ions in a transistor region of the semiconductor substrate below the epitaxial layer to form a source/drain region.

2 Claims, 5 Drawing Sheets

(Related Art)

CMOS IMAGE SENSOR AND METHOD FOR MANUFACTURING THE SAME

RELATED APPLICATION(S)

This application claims the benefit under 35 U.S.C. §119 (e) of Korean Patent Application No. 10-2005-0134180 filed Dec. 29, 2005, which is incorporated herein by reference in its entirety.

FIELD OF THE INVENTION

The present invention relates to an image sensor, and more particularly, to a complementary metal oxide silicon (CMOS) image sensor capable of reducing a dark current by a selective epitaxial growth (SEG) and a method for manufacturing the same.

BACKGROUND OF THE INVENTION

In general, an image sensor is a semiconductor device that transforms an optical image to electrical signals. The image sensor is generally classified as a charge coupled device (CCD) or a CMOS image sensor. A CCD type image sensor includes several MOS (metal oxide semiconductor) capacitors, closely positioned to one another, in which electric charge carriers are transferred to or saved in the MOS capacitors.

On the other hand, a CMOS image sensor has incorporated a switching mode by forming MOS transistors for each unit pixel with CMOS technology, and using control circuits and signal-processing circuits in conjunction with the MOS transistors to sequentially detect outputs of the photodiodes.

The CCD has various disadvantages, such as a complicated driving mode, high power consumption, impracticality of incorporating a signal processing circuit in a single chip for the CCD due to the many mask processes, and so on. Currently, in order to overcome these disadvantages, many studies have been made of the development of the CMOS image sensor using sub-micron CMOS manufacturing technology.

The CMOS image sensor obtains an image from the formation of a photodiode and a MOS transistor within a unit pixel to detect signals using a switching mode. As mentioned above, because the CMOS image sensor makes use of CMOS manufacturing technology, the CMOS image sensor has low power consumption, as well as a single manufacturing process requiring about 20 masks compared with the CCD manufacturing process requiring 30 to 40 masks. As a result, the CMOS image sensor can integrate a signal processing circuit into a single chip. Accordingly, the CMOS image sensor is currently used in various applications, such as digital still cameras (DSC), PC cameras, mobile cameras, and so forth.

The CMOS image sensor is classified as a 3T type, a 4T type or a 5T type according to the number of transistors formed in each unit pixel. The 3T type CMOS image sensor includes a single photodiode and three transistors, and the 4T type CMOS image sensor includes a single photodiode and four transistors. Hereinafter, the 4T type CMOS image sensor will be described with reference to a schematic and layout thereof.

Hereinafter, a 4T type CMOS image sensor according to the related art will be explained with reference to the accompanying drawings.

FIG. 1 is an equivalent circuit diagram of a 4T type CMOS image sensor. FIG. 2 is a layout of a unit pixel of 4T type CMOS image sensor according to the related art.

As shown in FIGS. 1 and 2, the unit pixel of the CMOS image sensor includes a photodiode 10 as a photoelectric transducer and four transistors.

Here, the four transistors include a transfer transistor (Tx/A) 20, a reset transistor (Rx/B) 30, a drive transistor (Dx/C) 40, and a select transistor (Sx/D) 50. A load transistor (not shown) is electrically connected to the drain of the select transistor (Sx/D) 50, which is an output terminal of each unit pixel.

A floating diffusion region (FD) 60 is formed between the transfer transistor (Tx/A) and the reset transistor (Rx/B) and connects to the gate of the drive transistor (Dx/C).

The construction of the CMOS image sensor may be expressed as follows. The image sensor is composed of a plurality of pixels, which are compactly aligned on a semiconductor epitaxial layer in a row and column formation. Referring to FIG. 2, the image sensor includes a photodiode P, a floating diffusion region 60, and a transfer transistor A. The photodiode P senses external light and generates photo-electrons. The floating diffusion region transfers charges from the photodiode. The transfer transistor A is disposed between the photodiode P and the floating diffusion region, and transfers the charges from the photodiode to the floating diffusion region.

The following is a description of the operation of the image sensor.

First, the reset transistor B is initially turned on so that the potential of the output floating diffusion node becomes the source voltage. At this time, the reference value is detected.

Next, when light from an exterior of the image sensor is incident to the photodiode P, an Electron-Hole Pair (EHP) is generated in proportion to the incident light.

Then, due to a signal charge generated in the photodiode P, the potential of the source node of the transfer transistor changes proportional to an amount of the generated signal charge.

Thereafter, when the transfer transistor A is turned-on, the stored signal charge is transferred to the floating diffusion region. The potential of the output floating diffusion node changes corresponding to the amount of the transferred signal charge. Simultaneously, the gate bias of the drive transistor C varies with the potential of the output floating diffusion node. In the event when the drive transistor turns on, it causes the source potential of the drive transistor C to be changed.

Next, the drive transistor D becomes in an ON state, and data is read out in a column direction.

Then, the reset transistor B is turned on to cause the output floating diffusion node potential to become VDD. This procedure then repeats.

Red, green, and blue color filter arrays are formed at an upper portion of each photodiode, and separately receive for separation red, green, and blue wavelengths. A micro lens is formed at an upper most end of a light receiving portion in order to improve the amount of light incident the photodiode. A signal from each channel is connected to an image processing circuit formed outside the light receiving portion through a plurality of metal lines, and is again combined as one phase through a signal processing procedure. As 0.18 µm and 0.13 µm technology semiconductor technology develops, a size of a pixel tends to be significantly reduced.

A dark current is a phenomenon where electrons move to a floating diffusion region in a photodiode while no light is present. The dark current is mainly incurred from various defects such as line defects and point defects, or from silicon dangling bonds at the surface of a photodiode in an active region. In other words, defects of the lattice structure functions as a trap to capture electrons, which creates the dark current. Such a dark current can cause a serious problem such as a hot pixel due to long exposure or a dark noise level non-uniformity in low illumination intensity.

Conventionally, in order to reduce the dark current, channel stop ions are implanted in an edge part of an active region and a field region. Further, so as to reduce a trap due to the dangling bond, $H_2$ annealing is performed or a buried type photodiode is used. Here, in the buried type photodiode, a photodiode is formed under the surface of the substrate.

BRIEF SUMMARY

Accordingly, embodiments of the present invention are directed to a CMOS image sensor and a method for manufacturing the same that substantially obviates one or more problems due to limitations and disadvantages of the related art.

An object of embodiments of the present invention is to provide a CMOS image sensor, which can reduce a dark current by performing a selective epitaxial growth (SEG) and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a CMOS (complementary metal oxide silicon) image sensor comprising: a semiconductor substrate in which an isolation region and an active region are defined; a photodiode formed at a predetermined part of the active region of the semiconductor substrate; a plurality of gate polys formed on a transistor region of the active region; spacers formed at both sides of the gate polys; and epitaxial layers formed by a selective epitaxial growth on the semiconductor substrate and the gate polys, but not on the isolation region and the spacers.

In another embodiment of the present invention, there is provided a method for manufacturing a CMOS (complementary metal oxide silicon) image sensor comprising; preparing a semiconductor substrate in which a device isolation region and an active region are defined; forming a gate pattern including a gate oxide layer and a gate poly on the semiconductor substrate; implanting n-type impurity ions in a predetermined part of the active region of the semiconductor substrate to form a photodiode region; forming a spacer at a sidewall of the gate pattern; forming a p-type impurity region at a surface of the photodiode region; forming an epitaxial layer on surfaces of the semiconductor substrate and on the gate pattern except for on the device isolation region and the spacers by performing a selective epitaxial growth; and implanting n+ type ions in the semiconductor substrate through the epitaxial layer using a mask covering the photodiode region to form a source/drain region.

Preferably, the selective epitaxial growth is achieved by a low temperature chemical vapor deposition method.

More preferably, the method further comprises performing a hydrogen annealing on the semiconductor substrate prior to the selective epitaxial growth.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 3A through 3G are cross-sectional views of a CMOS image sensor for describing a method of manufacturing a CMOS image sensor according to an embodiment of the present invention.

Figure 1:
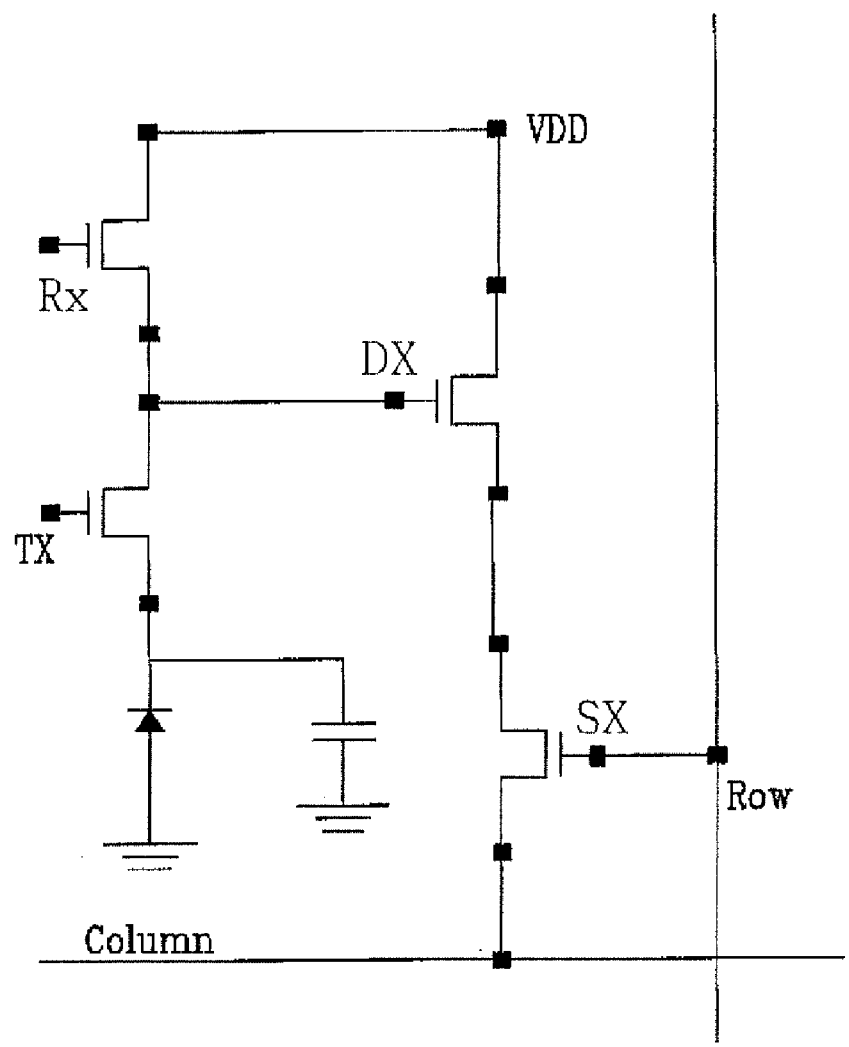
FIG. 1 is a circuit diagram of a 4T type CMOS image sensor according to the related art.
Figure 2:
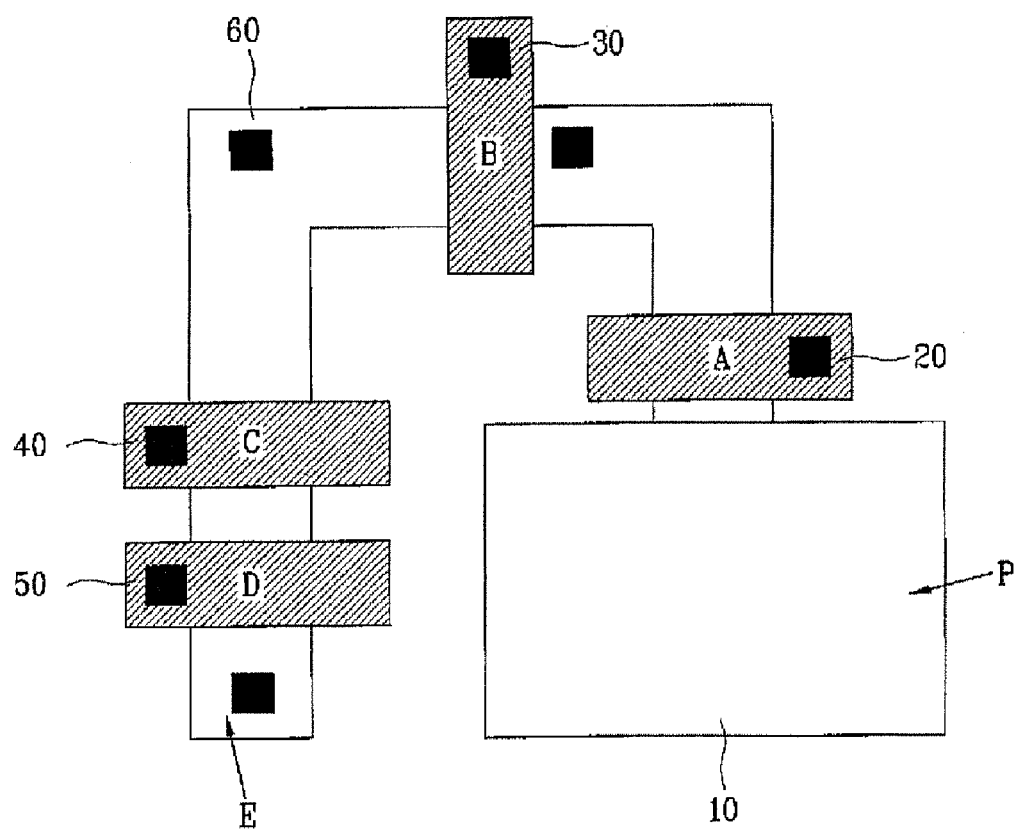
FIG. 2 is a layout of a unit pixel of 4T type CMOS image sensor according to the related art.
Figure 3A:
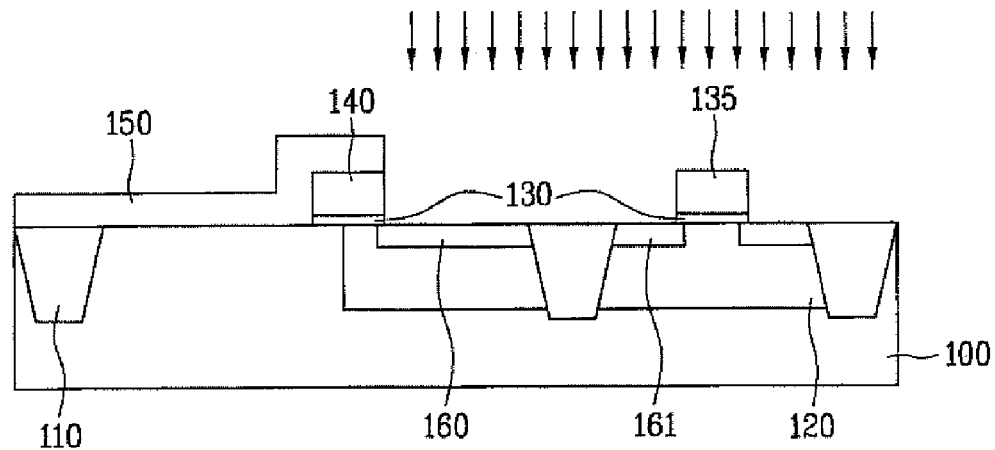
FIGS. 3A through 3G are cross-sectional views of a CMOS image sensor for describing a method of manufacturing a CMOS image sensor according to an embodiment of the present invention.

Referring to FIG. 3A, a shallow trench isolation (STI) layer 110 can be formed on a semiconductor substrate 100. In an embodiment, the semiconductor substrate can be made of an epitaxial layer.

Next, a p-well 120 can be formed in a transistor region of the semiconductor substrate 100 by implanting p-type impurity ions into the active region, but not where the photodiode will be formed.

An oxide layer and a gate silicon layer can be sequentially deposited on the semiconductor substrate 100, and can be etched to form a gate pattern of a gate oxide layer 130 and a gate electrode. FIG. 3A illustrates gate electrodes 135 and 140.

A first photoresist layer pattern 150 can be formed on the substrate to cover the photodiode region and an adjacent transfer transistor electrode 140 while exposing the transistor region. Then, n-type impurity ions can be implanted using the first photoresist layer pattern 150 as a mask to form n-LDD regions 160 and 161.

Figure 3B:
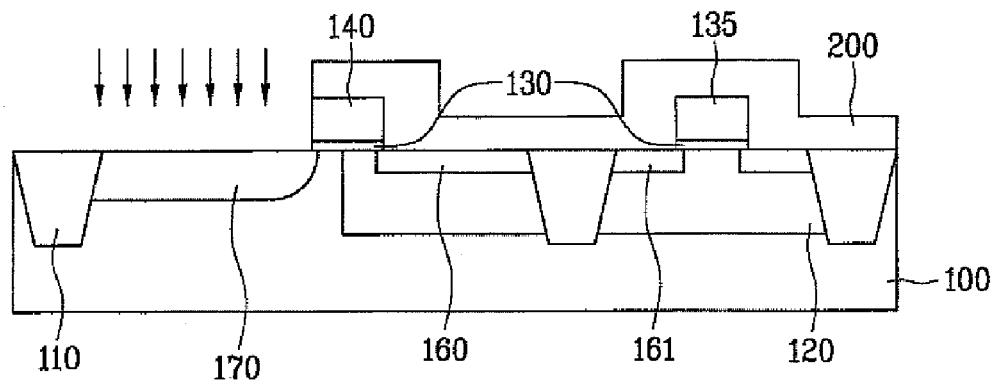

Referring to FIG. 3B, a second photoresist layer pattern 200 can be formed on the substrate to expose the photodiode region. Then, n-type impurity ions can be implanted into the exposed substrate using the second photoresist layer pattern 200 as a mask to form a photodiode 170.

Figure 3C:
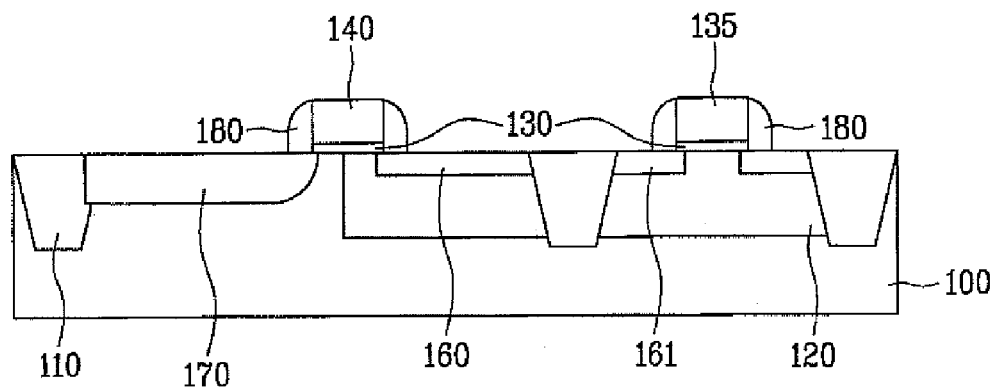

Referring to FIG. 3C, after the second photoresist layer 200 has been removed, an insulating layer can be deposited on an entire surface of the semiconductor substrate 100 including the gate electrodes 135 and 140. The insulating layer can be selectively removed to form spacers 180 at sidewalls of the gate patterns.

Figure 3D:
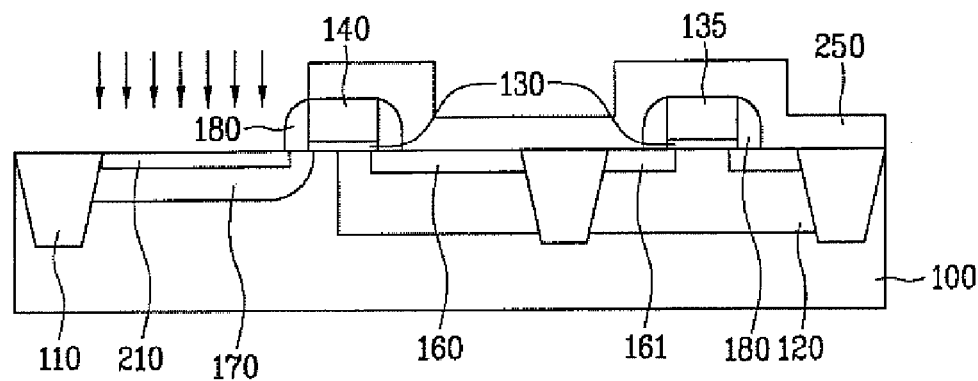
Figure 3E:
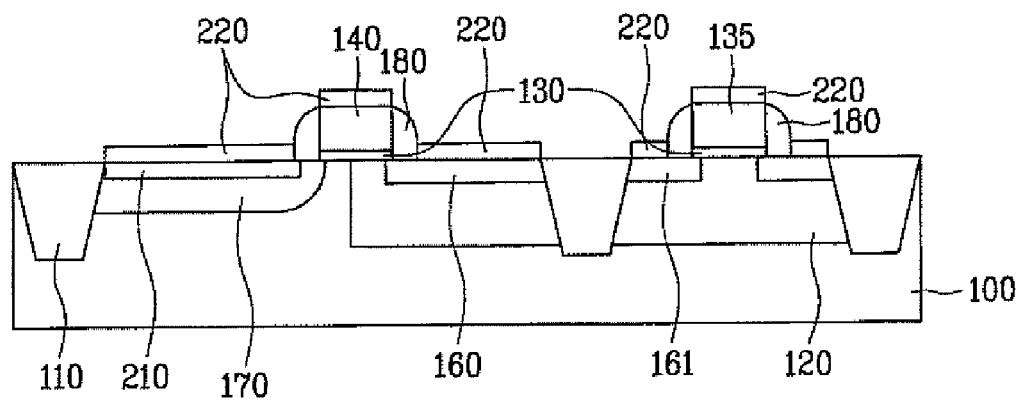

Referring to FIG. 3D, a third photoresist layer pattern 250 can be formed. The third photoresist pattern 250 can have the same pattern as the second photoresist layer pattern 200. Then, p-type impurity ions can be implanted therein using the third photoresist layer pattern 250 as a mask, thereby forming a p-type impurity region 210 at a surface of the photodiode region 170.

Thereafter, in an embodiment, a hydrogen annealing can be performed on the semiconductor substrate 100 using hydrogen gas at a high temperature. The hydrogen annealing removes oxygen remaining on a silicon substrate. The hydrogen annealing improves the growth of the epitaxial layer in a subsequent step because silicon can not grow satisfactorily where unnecessary oxygen remains Referring to FIG. 3E, a selective epitaxial growth (SEG) can be achieved by a low temperature chemical vapor deposition (LPCVD) method to form epitaxial layers 220 at upper portions of the gate pattern layers 135 and 140, and a surface of the semiconductor substrate 100. The epitaxial layer can be formed on the active region, but is not formed on the STI layer 110 or the spacers 180.

Since the dangling bonds in the p-type impurity region 210 at the surface of the photodiode region 170 can be controlled by the selective epitaxial growth, it can be expected that a dark current characteristic is enhanced. That is, dark current can be reduced.

Figure 3F:
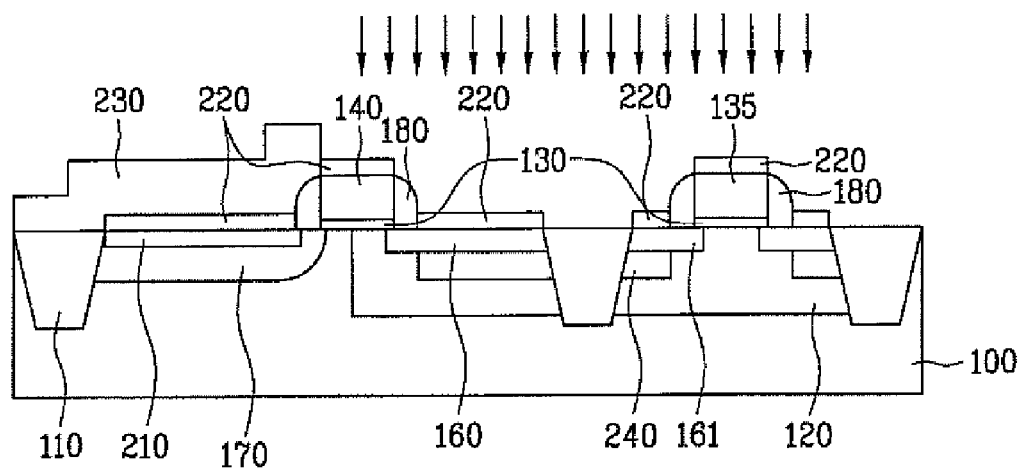

Referring to FIG. 3F, a fourth mask 230 can be formed to cover the photodiode region 170. Then, n+ type ions can be implanted in the semiconductor substrate 100 below the epitaxial layer 220 to form a source/drain region 240.

Figure 3G:
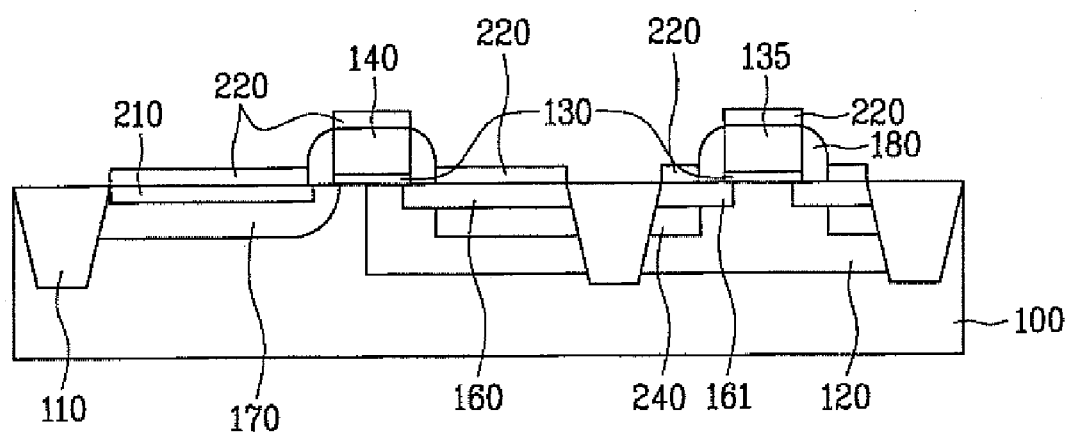

As shown in FIG. 3G, the fourth photoresist layer 230 is removed.

As is seen from the forgoing description, in the method for manufacturing a CMOS image sensor according to embodiments of the present invention, the selective epitaxial growth can form a poly layer on the gate silicon.

In order to enhance dark current characteristics in the CMOS image sensor, the present invention provides a method for manufacturing a CMOS image sensor capable of improving dark current characteristics of a photodiode based on the surface characteristics of the silicon by performing SEG.

As shown in FIG. 3G, the image sensor according to an embodiment of the present invention includes a semiconductor substrate 100 in which an STI layer 110 and an active region are defined; a photodiode incorporating an n-type region 170 and a p-type region 210 formed at a predetermined part of the active region of the semiconductor substrate 100; a plurality of gate patterns including gate oxide layer 130 and electrodes 135 and 140 formed on a transistor region of the substrate; spacers 180 formed at both sides of the gate patterns including gate oxide layer 130 and gate electrodes 135 and 140; and epitaxial layers 220 formed by a selective epitaxial growth on the semiconductor substrate 100 and on the gate patterns, but not on the STI layer 110 and the spacers 180.

The CMOS image sensor and method for manufacturing the same according to embodiments of the present invention have followings advantages.

The generation of the dark current in the photodiode can be controlled by the surface characteristics of the silicon by performing a SEG process.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method for manufacturing a CMOS (complementary metal oxide silicon) image sensor comprising:

preparing a semiconductor substrate in which a device isolation region and an active region are defined;

forming a gate pattern including a gate oxide layer and a gate electrode on the semiconductor substrate;

forming a spacer at a sidewall of the gate pattern;

forming a photodiode comprising a n-type region in a part of the active region and a p-type region on the n-type region;

performing a hydrogen annealing on the p-type region of the photodiode, the semiconductor substrate, and the gate pattern;

forming an epitaxial layer on the p-type region of the photodiode, the semiconductor substrate and the gate pattern, but not on the device isolation region and not on the spacers, by performing a selective epitaxial growth; and implanting n+ type ions in the semiconductor substrate through the epitaxial layer to form a source/drain region using a mask covering the photodiode region after forming the epitaxial layer.

2. The method according to claim 1, wherein the selective epitaxial growth is achieved by a low temperature chemical vapor deposition method.

* * * * *